United States Patent
Hagimoto et al.

(10) Patent No.: US 9,938,638 B2
(45) Date of Patent: Apr. 10, 2018

(54) METHOD FOR PRODUCING SEMICONDUCTOR EPITAXIAL WAFER AND SEMICONDUCTOR EPITAXIAL WAFER

(71) Applicant: SHIN-ETSU HANDOTAI CO., LTD., Tokyo (JP)

(72) Inventors: Kazunori Hagimoto, Takasaki (JP); Masaru Shinomiya, Annaka (JP); Keitaro Tsuchiya, Takasaki (JP); Hirokazu Goto, Minato-ku (JP); Ken Sato, Miyoshi-machi (JP); Hiroshi Shikauchi, Niiza (JP); Shoichi Kobayashi, Jyoetsu (JP); Hirotaka Kurimoto, Jyoetsu (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 0 days.

(21) Appl. No.: 15/121,177

(22) PCT Filed: Feb. 10, 2015

(86) PCT No.: PCT/JP2015/000597
§ 371 (c)(1),
(2) Date: Aug. 24, 2016

(87) PCT Pub. No.: WO2015/133064
PCT Pub. Date: Sep. 11, 2015

(65) Prior Publication Data
US 2017/0029977 A1    Feb. 2, 2017

(30) Foreign Application Priority Data

Mar. 5, 2014   (JP) ................. 2014-042815

(51) Int. Cl.
C30B 33/00    (2006.01)
H01L 21/02    (2006.01)
(Continued)

(52) U.S. Cl.
CPC .............. *C30B 33/00* (2013.01); *C23C 16/34* (2013.01); *C23C 16/56* (2013.01); *C30B 25/00* (2013.01);
(Continued)

(58) Field of Classification Search
CPC ....... C30B 33/00; C30B 33/10; C30B 25/183; C30B 25/00; C30B 29/406;
(Continued)

(56) References Cited

U.S. PATENT DOCUMENTS 7,968,859 B2 * 6/2011 Young ................ G01N 21/9503
250/221
9,340,900 B2 * 5/2016 Nakahara ................ C30B 25/20
(Continued)

FOREIGN PATENT DOCUMENTS

CN    102959682 A    3/2013
EP    451855 A1    10/1991
(Continued)

OTHER PUBLICATIONS

English Machine translation of JP 2009-073710 A, Panasonic Corp., Apr. 9, 2009.*
(Continued)

*Primary Examiner* — Anita K Alanko
(74) *Attorney, Agent, or Firm* — Oliff PLC

(57) ABSTRACT

A method for producing a semiconductor epitaxial wafer, including steps of: fabricating an epitaxial wafer by epitaxially growing a semiconductor layer on a silicon-based substrate; observing the outer edge portion of the fabricated epitaxial wafer; and removing portions in which a crack, epitaxial layer peeling, and a reaction mark observed in the step of observing are present. As a result, a method for
(Continued)

producing a semiconductor epitaxial wafer in which a completely crack-free semiconductor epitaxial wafer can be obtained, is provided.

9 Claims, 4 Drawing Sheets

(51) Int. Cl.

| | |
|---|---|
| H01L 21/78 | (2006.01) |
| H01L 29/20 | (2006.01) |
| C23C 16/34 | (2006.01) |
| C23C 16/56 | (2006.01) |
| C30B 25/18 | (2006.01) |
| C30B 29/40 | (2006.01) |
| C30B 33/10 | (2006.01) |
| H01L 29/32 | (2006.01) |
| H01L 21/66 | (2006.01) |
| C30B 25/00 | (2006.01) |

(52) U.S. Cl.
CPC .......... *C30B 25/183* (2013.01); *C30B 29/406* (2013.01); *C30B 33/10* (2013.01); *H01L 21/02013* (2013.01); *H01L 21/02019* (2013.01); *H01L 21/02021* (2013.01); *H01L 21/02024* (2013.01); *H01L 21/0254* (2013.01); *H01L 21/0262* (2013.01); *H01L 21/02378* (2013.01); *H01L 21/02381* (2013.01); *H01L 21/02458* (2013.01); *H01L 21/7806* (2013.01); *H01L 22/12* (2013.01); *H01L 22/20* (2013.01); *H01L 29/2003* (2013.01); *H01L 29/32* (2013.01)

(58) Field of Classification Search
CPC ......... H01L 21/02024; H01L 21/02378; H01L 21/02021; H01L 21/02019; H01L 21/0262; H01L 21/02013; H01L 21/02381; H01L 21/0254; H01L 21/02458; H01L 21/7806; H01L 29/2003; H01L 29/32; H01L 22/20; H01L 22/12; C23C 16/34; C23C 16/56
See application file for complete search history.

(56) References Cited

U.S. PATENT DOCUMENTS

| | | |
|---|---|---|
| 2007/0148920 A1 | 6/2007 | Kasai et al. |
| 2013/0087807 A1 | 4/2013 | Ikuta et al. |
| 2015/0028457 A1 | 1/2015 | Shikauchi et al. |

FOREIGN PATENT DOCUMENTS

| | | |
|---|---|---|
| JP | S59-227117 A | 12/1984 |
| JP | H03-295235 A | 12/1991 |
| JP | 2007-197302 A | 8/2007 |
| JP | 2007-246289 A | 9/2007 |
| JP | 2009-073710 A | 4/2009 |
| JP | 2011-044505 A | 3/2011 |
| JP | 2011-091143 A | 5/2011 |
| JP | 2011-165962 A | 8/2011 |
| JP | 2012-142485 A | 7/2012 |
| JP | 2013-171898 A | 9/2013 |
| WO | 2011/161975 A1 | 12/2011 |

OTHER PUBLICATIONS

Sep. 6, 2016 Preliminary Report on Patentability issued in International Patent Application No. PCT/JP2015/000597.
Apr. 21, 2015 International Search Report issued in International Patent Application No. PCT/JP2015/0005997.
Jan. 4, 2017 Office Action issued in Japanese Patent Application No. 2014-042815.
Feb. 8, 2017 Office Action issued in Taiwanese Patent Application No. 104105871.
Aug. 1, 2017 Office Action issued in Japanese Application No. 2014-042815.

\* cited by examiner

METHOD FOR PRODUCING SEMICONDUCTOR EPITAXIAL WAFER AND SEMICONDUCTOR EPITAXIAL WAFER

BACKGROUND OF THE INVENTION

1. Field of the Invention

The present invention relates to a method for producing a semiconductor epitaxial wafer having an epitaxial growth layer on a silicon-based substrate and to a semiconductor epitaxial wafer.

2. Description of the Related Art

In order to produce a semiconductor epitaxial wafer, epitaxial growth is performed on the front surface of a silicon-based substrate (for example, a silicon substrate or a silicon carbide substrate) or the like by using a commercially available epitaxial production apparatus, whereby a hetero-homo epitaxial wafer is produced.

In an epitaxial wafer having an epitaxial growth layer composed of a nitride semiconductor, the epitaxial growth layer disposed on a silicon-based substrate, the film thickness of the epitaxial growth layer increases on the outer edge portion and a crown (a projection protruding from the main surface of the growth layer) in the epitaxial growth layer appears.

Conditions such as the thickness of each layer of the epitaxial growth layer are selected such that warpage of the silicon-based substrate and stress in the epitaxial growth layer are optimized in a central part of a wafer which is used as a semiconductor device. As a result, if the crown appears, the balance between the stress produced in the epitaxial growth layer and the warpage of the substrate is lost, which affects the epitaxial growth layer and causes hexagonal patterned cracks or the like to appear in the epitaxial growth layer near the outer edge portion.

In order to prevent the appearance of such a crown, a method of, for example, chamfering the outer edge portion of a silicon-based substrate and forming an epitaxial growth layer thereon is proposed (for example, Patent Literature 1).

Moreover, as measures against cracks, performing epitaxial growth after roughening the surface near a Si substrate edge (Patent Literature 2), using, as a substrate for hetero epitaxial growth, a silicon substrate whose principal surface is the (111) plane having orientation flat in a direction obtained by rotating the <110> direction at an angle of 30°, 90°, or 150° in a counterclockwise direction by using the <111> direction as a rotation axis (Patent Literature 3), performing epitaxial growth in a state in which the periphery portion of a silicon-based substrate is covered with a ring (Patent Literature 4), and so forth are proposed.

Furthermore, in an epitaxial wafer having a GaN layer and an AlN layer epitaxially grown on a silicon substrate, if a crack appears at the edge portion of the wafer during epitaxial growth, gas of TMA (trimethylaluminum) or TMG (trimethylgallium) which is the source gas enters through an opening of the crack and reacts with Si, whereby a reaction mark appears.

As measures against such a reaction mark, growing a thick GaN film epitaxially on a SOI substrate via a buffer film (an AlN film) is proposed (Patent Literature 5).

CITATION LIST

Patent Literature

[Patent Literature 1] Japanese Unexamined Patent Publication (Kokai) No. 59-227117

[Patent Literature 2] International Publication No. WO2011/161975

[Patent Literature 3] Japanese Unexamined Patent Publication (Kokai) No. 2011-165962

[Patent Literature 4] Japanese Unexamined Patent Publication (Kokai) No. 2013-171898

[Patent Literature 5] Japanese Unexamined Patent Publication (Kokai) No. 2007-246289

SUMMARY OF THE INVENTION

However, under the present circumstances, even in an epitaxial wafer generally called "crack-free", a crack is present in about a few-mm range from the outer edge portion due to the appearance of a crown.

It is feared that this crack extends in a device production process and a production line is contaminated by inducing peeling of an epitaxial growth layer in a device production process. For this reason, a completely crack-free epitaxial substrate is desired.

The present invention has been made in view of the problem, and a purpose thereof is to provide a method for producing a semiconductor epitaxial wafer in which a completely crack-free semiconductor epitaxial wafer can be obtained.

To attain the above purpose, the present invention provides a method for producing a semiconductor epitaxial wafer, including: fabricating an epitaxial wafer by epitaxially growing a semiconductor layer on a silicon-based substrate; observing the outer edge portion of the fabricated epitaxial wafer; and removing portions in which a crack, epitaxial layer peeling, and a reaction mark observed in the step of observing are present.

As described above, by observing the outer edge portion of the fabricated epitaxial wafer and removing the portions in which the observed crack, epitaxial layer peeling, and reaction mark are present, it is possible to obtain a completely crack-free semiconductor epitaxial wafer easily and suppress contamination of a production line caused as a result of a crack extending or causing peeling of an epitaxial growth layer in a subsequent process such as a device production process.

At this time, it is preferable that, in the step of removing, the portions in which the crack, the epitaxial layer peeling, and the reaction mark are present are ground without change in the outer diameter of the silicon-based substrate of the epitaxial wafer.

As described above, by grinding the portions in which the crack, the epitaxial layer peeling, and the reaction mark are present without changing the outer diameter of the silicon-based substrate of the epitaxial wafer, there is no need to give consideration to a change in the diameter of the epitaxial wafer in a subsequent process, whereby it is possible to use the same apparatus and jig corresponding to the diameter of a yet-to-be-ground silicon-based substrate.

At this time, it is preferable that, after the step of removing, a ground surface of the epitaxial wafer is turned into a mirror surface or a quasi-mirror surface by mixed acid etching.

As described above, by turning the ground surface of the epitaxial wafer into a mirror surface or a quasi-mirror surface by mixed acid etching, it is possible to suppress particle generation from the ground portion.

At this time, it is preferable that an overhang portion of the epitaxial layer, the overhang portion formed as a result of the silicon-based substrate being etched by the mixed acid etching, is removed by chamfering.

As described above, by removing the overhang portion of the epitaxial layer by chamfering, it is possible to prevent the overhang portion from being chipped in a subsequent process.

At this time, it is possible to adopt a configuration in which the semiconductor layer is composed of a nitride semiconductor.

As a semiconductor layer to be epitaxially grown, the nitride semiconductor can be suitably used.

At this time, the nitride semiconductor may be one or more than one of AlN, GaN, InN, and a mixed crystal thereof.

As a nitride semiconductor that is used in a semiconductor layer to be epitaxially grown, the materials can be suitably used.

Moreover, the present invention provides a semiconductor epitaxial wafer in which a semiconductor layer is epitaxially grown on a silicon-based substrate, wherein, at the outer edge portion of the semiconductor epitaxial wafer, at least part of the semiconductor layer is removed.

As described above, as a result of at least part of the epitaxially grown semiconductor layer being removed on the outer edge portion of the semiconductor epitaxial wafer, it is possible to remove the portions in which a crack, epitaxial layer peeling, and a reaction mark which appear on the outer edge portion of the semiconductor epitaxial wafer are present, which makes it possible to obtain a completely crack-free semiconductor epitaxial wafer easily and obtain a semiconductor epitaxial wafer that does not cause extending of the crack and contamination of a production line caused by inducing peeling of an epitaxial growth layer in a subsequent process such as a device production process.

At this time, it is preferable that surface of the region in which at least part of the semiconductor layer is removed, is a mirror surface or a quasi-mirror surface.

With such a configuration, it is possible to suppress particle generation from the removal portion.

At this time, it is possible to adopt a configuration in which, in a region where at least part of the semiconductor layer is removed, the silicon-based substrate is exposed.

Such a configuration can ensure more reliable removal of the portions in which the crack, the epitaxial layer peeling, and the reaction mark which appear on the outer edge portion of the semiconductor epitaxial wafer are present.

At this time, it is possible to adopt a configuration in which the semiconductor layer is composed of a nitride semiconductor.

In an epitaxial wafer of a nitride semiconductor, a crack, epitaxial layer peeling, and a reaction mark appear on the periphery portion thereof without exception; therefore, the present invention is particularly useful when a semiconductor layer which is epitaxially grown is a nitride semiconductor.

At this time, the nitride semiconductor may be one or more than one of AlN, GaN, InN, and a mixed crystal thereof.

When the present invention is applied to a semiconductor epitaxial wafer using the above materials as a nitride semiconductor that is used in a semiconductor layer to be epitaxially grown, it is possible to obtain a completely crack-free semiconductor epitaxial wafer more effectively.

As described above, according to the present invention, it is possible to obtain a completely crack-free semiconductor epitaxial wafer easily and suppress extending of the crack and contamination of a production line caused by inducing peeling of an epitaxial growth layer in a subsequent process such as a device production process.

DETAILED DESCRIPTION OF THE PREFERRED EMBODIMENTS

Figure 1:
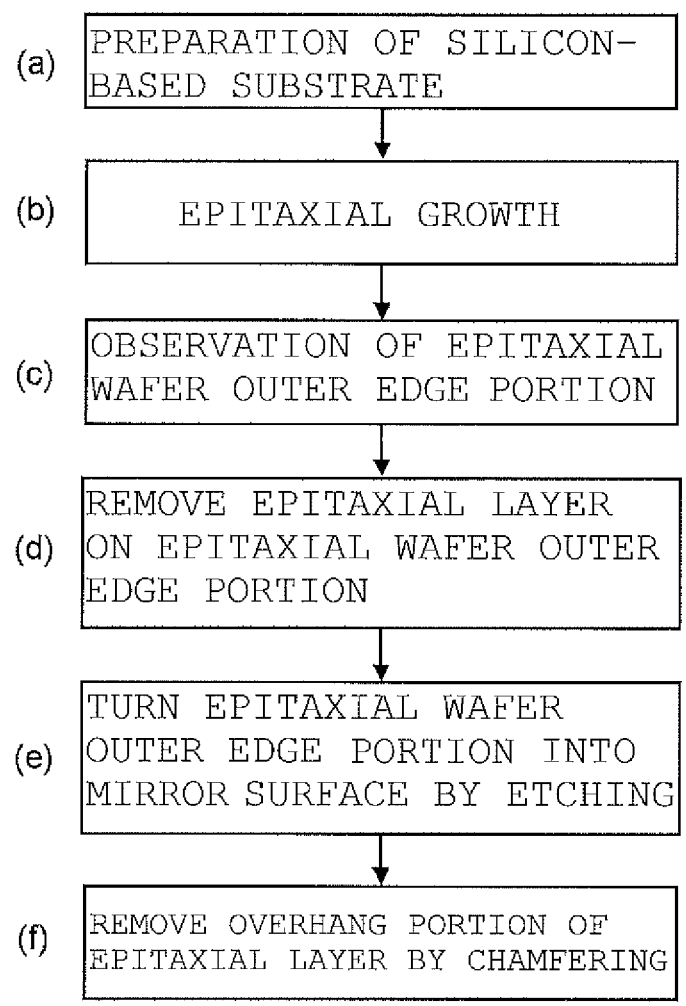
FIG. 1 is a diagram depicting an example of a production flow of a method for producing a semiconductor epitaxial wafer according to the present invention.

Hereinafter, the present invention will be described in detail as an example of an embodiment with reference to the drawings, but the present invention is not restricted thereto.

As mentioned earlier, under the present circumstances, even in an epitaxial wafer called "crack-free", a crack is present in about a few-mm range from the outer edge due to the appearance of a crown, and it is feared that this crack extends in a device production process and a production line is contaminated by inducing peeling of an epitaxial growth layer in a device production process. For this reason, a completely crack-free epitaxial substrate is desired.

Thus, the present inventors have earnestly studied a method for producing a semiconductor epitaxial wafer which can obtain a completely crack-free semiconductor epitaxial wafer easily and suppress extending of the crack and contamination of a production line caused by inducing peeling of an epitaxial growth layer in a subsequent process such as a device production process.

As a result, the present inventors have found that, by observing the outer edge portion of a fabricated epitaxial wafer and removing the portions in which the observed crack, epitaxial layer peeling, and reaction mark are present, it is possible to obtain a completely crack-free semiconductor epitaxial wafer easily and suppress extending of the crack and contamination of a production line caused by inducing peeling of an epitaxial growth layer in a subsequent process such as a device production process, thereby bringing the present invention to completion.

Hereinafter, with reference to FIG. 1, the method for producing a semiconductor epitaxial wafer according to the present invention will be explained.

First, as depicted in FIG. 1(a), a silicon-based substrate is prepared and placed in an epitaxial growth furnace. The silicon-based substrate is, for example, a silicon (Si) substrate or a silicon carbide (SiC) substrate.

Next, as depicted in FIG. 1(b), by using an epitaxial growth method such as metal-organic chemical vapor deposition (MOCVD), an epitaxial growth layer is formed on the silicon-based substrate set at a temperature higher than or equal to 900° C., for example, at 1200° C.

The composition of this epitaxial layer is not limited to a particular composition; the epitaxial layer may be composed of a nitride semiconductor and this nitride semiconductor may be one or more than one of AlN, GaN, InN, and a mixed crystal thereof. For example, it is possible to, after forming an AlN layer, grow a buffer layer formed of alternately stacked AlGaN layers and GaN layers, and form a GaN layer on the surface thereof, and growth is performed such that the resultant layer has a thickness of about 3 to 10 µm as a whole.

Next, as depicted in FIG. 1(c), the epitaxial wafer outer edge portion is observed to check the presence or absence of a crack, a reaction mark, and epitaxial layer peeling and the location where the crack, the reaction mark, or the epitaxial layer peeling appeared. The observation method is not limited to a particular method; for example, it is possible to make visual observations of a crack and a reaction mark under collimated light and observe film peeling and a reaction mark under a microscope.

Next, as depicted in FIG. 1(d), the portion where the crack appeared, the portion where the reaction mark appeared, and the portion where the peeling of epitaxial layer appeared are removed by grinding.

At this time, it is preferable to grind the portions in which the crack, the epitaxial layer peeling, and the reaction mark are present without changing the outer diameter of the silicon-based substrate of the epitaxial wafer.

As described above, by grinding the portions in which the crack, the epitaxial layer peeling, and the reaction mark are present without changing the outer diameter of the silicon-based substrate of the epitaxial wafer, there is no need to give consideration to a change in the diameter of the epitaxial wafer in a subsequent process, whereby it is possible to use the same apparatus and jig corresponding to the diameter of a yet-to-be-ground silicon-based substrate.

Here, it is possible to perform grinding by using a commercially available grinding wheel such that outer edge portion of the wafer is ground in the width range of 1 to 15 mm to a depth which is deeper than the thickness of the epitaxial layer by about 1 to 250 µm.

In this case, the ground surface obtained after the epitaxial layer is completely removed is in a state in which the silicon-based substrate is exposed; however, it is necessary simply to eliminate defects such as cracks and the like, and complete removal of the epitaxial layer is not necessarily required.

Moreover, the removal method is not limited to grinding and etching or polishing may be used.

Next, as depicted in FIG. 1(e), the ground surface of the outer edge portion is etched by using, for example, a mixed acid to turn it into a mirror surface or a quasi-mirror surface. As described above, by turning the ground surface into a mirror surface or a quasi-mirror surface by etching, it is possible to suppress particle generation from the ground portion.

Incidentally, when a grinding wheel whose grit size is fine is used, etching does not necessarily have to be performed because surface roughness of the ground surface is reduced.

Moreover, the ground surface may be turned into a mirror surface by using CMP (chemical mechanical polishing).

Figure 4:
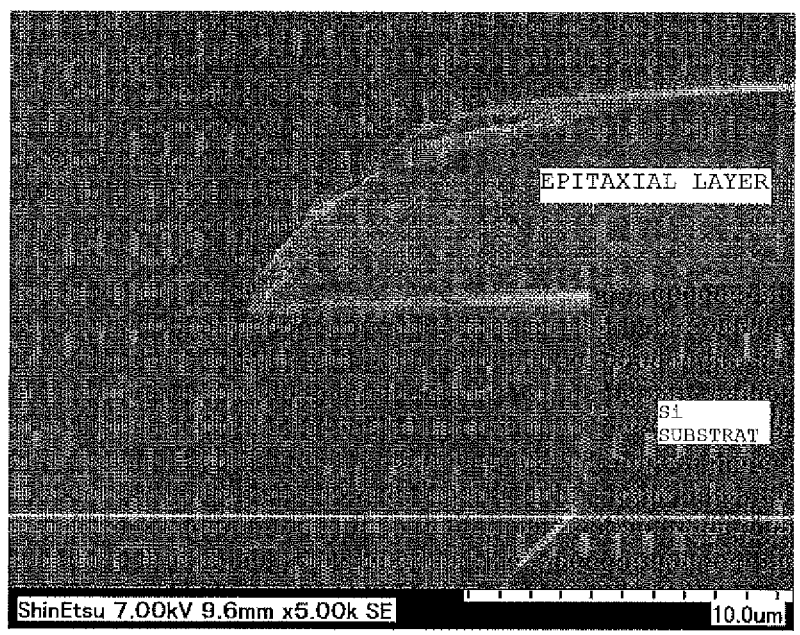
FIG. 4 is a diagram depicting an overhang portion of an epitaxial layer, the overhang portion being formed in a production process of the method for producing a semiconductor epitaxial wafer according to the present invention.

Next, as depicted in FIG. 1(f), an overhang portion (refer to FIG. 4) on the outer edge portion of the epitaxial layer, the overhang portion being formed by etching, is removed by chamfering. As described above, by removing the overhang portion, it is possible to prevent the overhang portion from being chipped in a subsequent process.

By producing a semiconductor epitaxial wafer in accordance with the production flow depicted in FIG. 1, it is possible to obtain a completely crack-free semiconductor epitaxial wafer easily and suppress extending of the crack and contamination of a production line caused by inducing peeling of an epitaxial growth layer in a subsequent process such as a device production process.

Next, a semiconductor epitaxial wafer according to the present invention will be explained.

The semiconductor epitaxial wafer according to the present invention is a semiconductor epitaxial wafer having a semiconductor layer epitaxially grown on a silicon-based substrate, wherein at least part of the semiconductor layer is removed at the outer edge portion of the semiconductor epitaxial wafer.

As a result of at least part of the epitaxially grown semiconductor layer being removed at the outer edge portion of the semiconductor epitaxial wafer, it is possible to remove the portions in which the crack, the epitaxial layer peeling, and the reaction mark which appear on the outer edge portion of the semiconductor epitaxial wafer are present, which makes it possible to obtain a completely crack-free semiconductor epitaxial wafer easily and suppress extending of the crack and contamination of a production line caused by inducing peeling of an epitaxial growth layer in a subsequent process such as a device production process.

Moreover, it is preferable that surface of a region where at least part of the epitaxially grown semiconductor layer is removed, is a mirror surface or a quasi-mirror surface.

Such a configuration makes it possible to suppress particle generation form the removal portion.

Furthermore, it is possible to adopt a configuration in which, in a region where at least part of the epitaxially grown semiconductor layer is removed, the silicon-based substrate is exposed.

Such a configuration ensures more reliable removal of the portions in which the crack, the epitaxial layer peeling, and the reaction mark which appear on the outer edge portion of the semiconductor epitaxial wafer are present.

Moreover, it is possible to adopt a configuration in which the epitaxially grown semiconductor layer is composed of a nitride semiconductor.

In an epitaxial wafer of a nitride semiconductor, a crack, epitaxial layer peeling, and a reaction mark appear on the periphery portion thereof without exception; therefore, the present invention is particularly useful when a semiconductor layer to be epitaxially grown is a nitride semiconductor.

This nitride semiconductor may be one or more than one of AlN, GaN, InN, and a mixed crystal thereof.

When the present invention is applied to a semiconductor epitaxial wafer using the above materials as a nitride semiconductor that is used in a semiconductor layer to be epitaxially grown, it is possible to obtain a completely crack-free semiconductor epitaxial wafer more effectively.

EXAMPLES

Hereinafter, the present invention will be described more specifically with Example and Comparative Example, but the present invention is not restricted to these examples.

Comparative Example

After an AlN layer was formed on a silicon substrate of 150 mm diameter and 1 mm thickness by epitaxial growth, a buffer layer formed of alternately stacked AlGaN layers and GaN layers was grown and a GaN layer was formed on the surface thereof.

The total thickness of the epitaxial layer was 10 µm.

When the outer edge portion of this semiconductor epitaxial wafer was observed with collimated light, cracks were observed almost all around the outer edge.

Moreover, epitaxial layer peelings were scattered all around the outer edge portion and reaction marks were sparsely scattered all around the outer edge portion.

Figure 3:
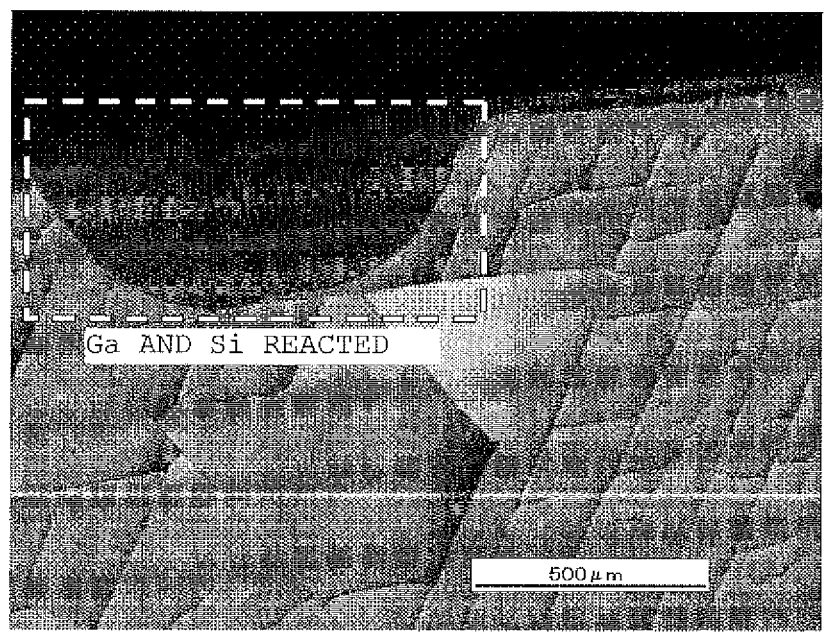
FIG. 3 is a diagram depicting a crack and a reaction mark observed on the periphery portion of a semiconductor epitaxial wafer of Comparative Example.

In FIG. 3, the state of the crack and the reaction mark on the periphery portion of the semiconductor epitaxial wafer fabricated in the manner described above is depicted.

Example

A semiconductor epitaxial wafer was fabricated in the same manner as Comparative Example.

After the outer edge portion of the fabricated semiconductor epitaxial wafer was observed with collimated light, a crack portion, an epitaxial layer peeling (epitaxial layer burr) portion, and a reaction mark portion on outer edge portion of the semiconductor epitaxial wafer were ground (subjected to terrace chamfering) by a grinding wheel in an area 10 μm wide and 50 μm deep.

Figure 2:
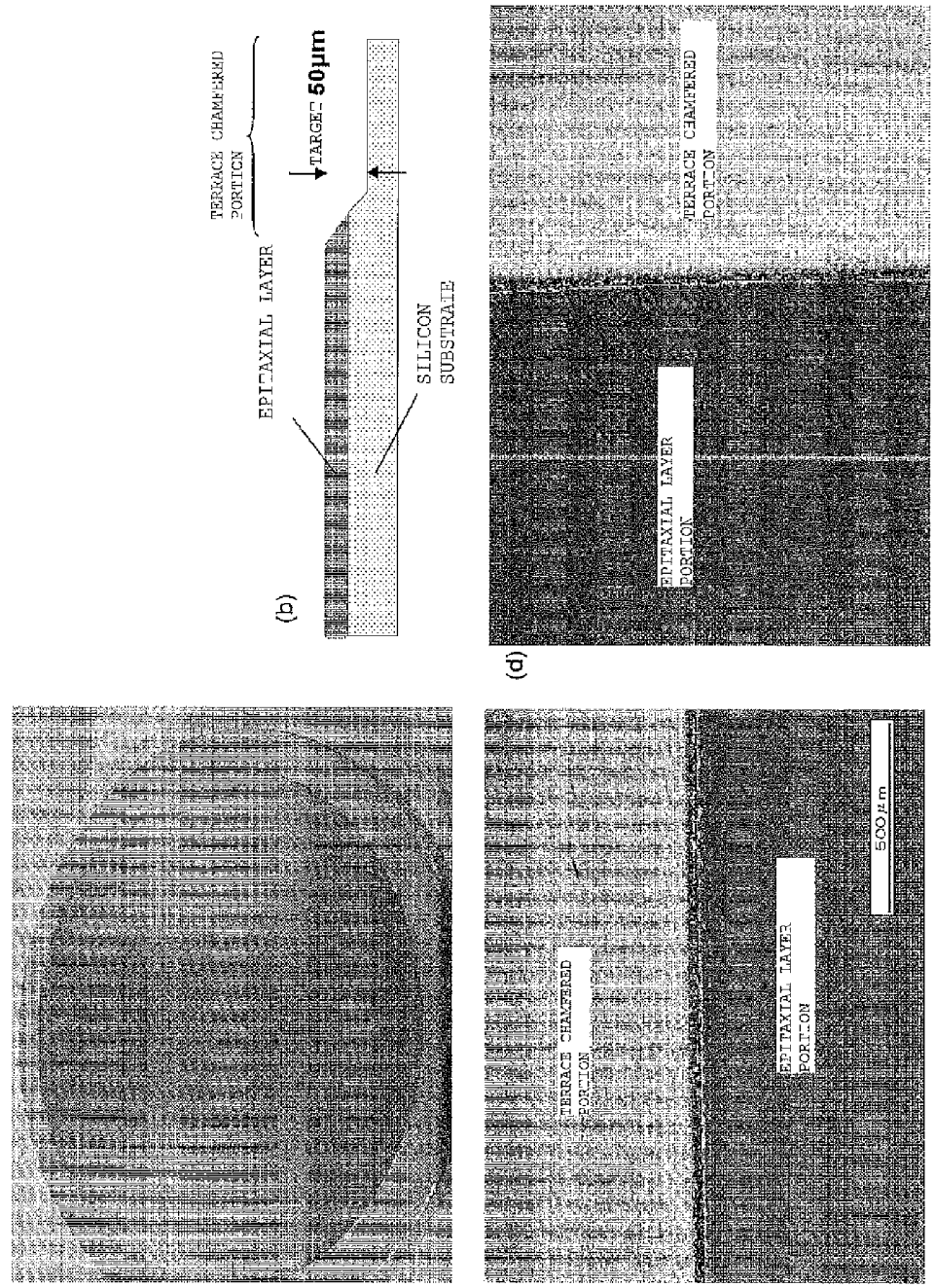
FIG. 2 is a diagram depicting a semiconductor epitaxial wafer produced by the method for producing a semiconductor epitaxial wafer according to the present invention.

The ground semiconductor epitaxial wafer is depicted in FIG. 2.

FIG. 2(a) is a photograph of the ground semiconductor epitaxial wafer when the semiconductor epitaxial wafer is viewed from diagonally above, FIG. 2(b) is a sectional view of the periphery portion of the ground semiconductor epitaxial wafer, and FIGS. 2(c) and 2(d) are enlarged photographs of an area near the border between an epitaxial layer portion and a terrace chamfered portion on the periphery portion of the ground semiconductor epitaxial wafer.

As is clear from FIG. 2, all the crack portions, epitaxial layer peeling (epitaxial layer burr) portions, and reaction mark portions on outer edge portion of the wafer are completely removed.

In addition, by performing mixed acid etching on the ground portion, the ground portion was turned into a mirror surface or a quasi-mirror surface.

Then, an overhang portion of the epitaxial layer, the overhang portion being formed by the mixed acid etching, was removed by tape chamfering.

It is to be understood that the present invention is not limited in anyway by the embodiment thereof described above. The above embodiment is merely an example, and anything that has substantially the same structure as the technical idea recited in the claims of the present invention and that offers similar workings and benefits falls within the technical scope of the present invention.

The invention claimed is:

1. A method for producing a semiconductor epitaxial wafer, comprising:
   fabricating an epitaxial wafer by epitaxially growing a semiconductor layer on a silicon-based substrate;
   observing a crack, epitaxial layer peeling, and a reaction mark in an outer edge portion of an upper surface of the fabricated epitaxial wafer; and
   removing portions in which a crack, epitaxial layer peeling, and a reaction mark at the epitaxially grown semiconductor layer observed in the step of observing are present, wherein
   in the step of removing, the portions in which the crack, the epitaxial layer peeling, and the reaction mark are present are ground without change in an outside diameter of the silicon-based substrate of the epitaxial wafer.

2. The method for producing a semiconductor epitaxial wafer according to claim 1, wherein
   after the step of removing, a ground surface of the epitaxial wafer is turned into a mirror surface or a quasi-mirror surface by mixed acid etching.

3. The method for producing a semiconductor epitaxial wafer according to claim 2, wherein
   an overhang portion of the epitaxial layer, the overhang portion formed as a result of the silicon-based substrate being etched by the mixed acid etching, is removed by chamfering.

4. The method for producing a semiconductor epitaxial wafer according to claim 1, wherein
   the semiconductor layer is composed of a nitride semiconductor.

5. The method for producing a semiconductor epitaxial wafer according to claim 2, wherein
   the semiconductor layer is composed of a nitride semiconductor.

6. The method for producing a semiconductor epitaxial wafer according to claim 3, wherein
   the semiconductor layer is composed of a nitride semiconductor.

7. The method for producing a semiconductor epitaxial wafer according to claim 4, wherein
   the nitride semiconductor is one or more than one of AlN, GaN, InN, and a mixed crystal thereof.

8. The method for producing a semiconductor epitaxial wafer according to claim 5, wherein
   the nitride semiconductor is one or more than one of AlN, GaN, InN, and a mixed crystal thereof.

9. The method for producing a semiconductor epitaxial wafer according to claim 6, wherein
   the nitride semiconductor is one or more than one of AlN, GaN, InN, and a mixed crystal thereof.

* * * * *